US006664867B1

(12) United States Patent
Chen

(10) Patent No.: US 6,664,867 B1
(45) Date of Patent: Dec. 16, 2003

(54) TUNABLE ELECTROMAGNETIC TRANSMISSION STRUCTURE FOR EFFECTING COUPLING OF ELECTROMAGNETIC SIGNALS

(75) Inventor: Shuguang Chen, Ellicott City, MD (US)

(73) Assignee: Paratek Microwave, Inc., Columbia, MD (US)

( * ) Notice: Subject to any disclaimer, the term of this patent is extended or adjusted under 35 U.S.C. 154(b) by 0 days.

(21) Appl. No.: 10/199,724

(22) Filed: Jul. 19, 2002

(51) Int. Cl.[7] .................................................. H03H 5/00

(52) U.S. Cl. ........................... 333/26; 333/33; 333/156; 333/254; 333/260

(58) Field of Search .............................. 333/26, 27, 33, 333/156, 157, 161, 254, 260

(56) References Cited

U.S. PATENT DOCUMENTS 6,028,561 A * 2/2000 Takei ......................... 343/767
6,100,775 A * 8/2000 Wen ............................ 333/33
6,512,431 B2 * 1/2003 Pergande .................... 333/246
6,590,468 B2 * 7/2003 du Toit et al. ............. 333/17.3

* cited by examiner

*Primary Examiner*—Michael Tokar
*Assistant Examiner*—Khai Nguyen
(74) *Attorney, Agent, or Firm*—Law Office of Donald D. Mondul

(57) ABSTRACT

A tunable electromagnetic transmission structure for effecting coupling of electromagnetic signals having a frequency includes: (a) a dielectric substrate having an opposing first side and second side; (b) at least one first conductive land occupying a first area on the first side; (c) at least two second conductive lands on the second side separated by at least one substantially linear channel; the at least one channel having a width established by the frequency; the at least two second conductive lands and the at least one channel occupying a second area generally in register with the first area; and (d) a tunable dielectric material at least substantially filling the at least one channel; the tunable dielectric layer being electrically coupled with at least two second conductive lands of the at least two second conductive lands.

18 Claims, 7 Drawing Sheets

TUNABLE ELECTROMAGNETIC TRANSMISSION STRUCTURE FOR EFFECTING COUPLING OF ELECTROMAGNETIC SIGNALS

CROSS REFERENCE TO RELATED APPLICATIONS

The following applications contain subject matter similar to the subject matter of this application.

U.S. patent application Ser. No. 10/199,266, filed Jul. 19, 2002; entitled "APPARATUS FOR COUPLING ELECTROMAGNETIC SIGNALS";

U.S. patent application Ser. No. 10/199,732, filed Jul. 19, 2002; entitled "WAVEGUIDE APPARATUS";

U.S. patent application Ser. No. 10/199,680, filed Jul. 19, 2002; entitled "ANTENNA APPARATUS".

BACKGROUND OF THE INVENTION

The present invention is directed to electromagnetic antennas, and especially to electromagnetic antennas employing a plurality of antenna elements known as patch antenna elements. Such patch antenna construction is advantageous in constructing antennas that are known as steerable beam antennas. Steerable beam antennas employ fixed antenna elements, such as patch antenna elements, to "steer" loci of sensitivity (i.e., transmitting beams or bearings of reception) by establishing predetermined interference patterns among the various patch antenna elements. The desired predetermined interference patterns are commonly effected by imposing phase differences among the various patch antenna elements.

One advantageous structure for imposing phase differences in electromagnetic signals delivered to or received by an antenna element has been disclosed in a pending patent application: application Ser. No. 09/838,483, filed Apr. 19, 2001, by Louise C. Sengupta and Andrey Kozyrev, for "WAVEGUIDE-FINLINE TUNABLE PHASE SHIFTER", assigned to the assignee of the present invention.

It is desirable that steerable beam antennas be small and compact in construction in order that such devices may be used in inconspicuous applications. Closely or densely situating antenna patch elements used in such steerable beam antennas is desirable in order that maximum interaction among the various patch antenna elements may be realized. Electromagnetic signal coupling apparatuses associated with each respective antenna patch element have heretofore occupied a relatively large space and have mitigated against compact construction of arrays of antenna elements, such as antenna patch elements in a steerable beam antenna device. As a result, antenna patch elements have not been as densely situated as desired. One solution has been disclosed in the above-cited patent application: a waveguide-finline tunable phase shifter device. However, a waveguide structure (as disclosed in the above-cited patent application) still occupies a greater space than is desired in order that dense arranging of antenna patch elements in an antenna apparatus may be realized. Installing an antenna patch element that occupies a larger area is one solution that has been employed to provide a larger expanse in the vicinity of that patch element for effecting the requisite electromagnetic coupling and to accommodate a larger phase shifter structure. However, the larger the respective patch elements, the less resolution that can be established in steering beam operations. That is, larger patch elements yield coarser beam patterns that result in coarser control of beam steering operations.

There is a need for an apparatus for effecting tunable phase shifting of electromagnetic signals that permits closely arranged arrays of small antenna patch elements.

While such an apparatus is particularly useful for steerable beam antennas using closely arranged antenna patch elements, the apparatus has utility in other antenna coupling structures and arrangements. The invention disclosed, described and claimed herein is not limited to steerable beam antenna devices.

SUMMARY OF THE INVENTION

A tunable electromagnetic transmission structure for effecting coupling of electromagnetic signals having a frequency includes: (a) a dielectric substrate having an opposing first side and second side; (b) at least one first conductive land occupying a first area on the first side; (c) at least two second conductive lands on the second side separated by at least one substantially linear channel; the at least one channel having a width established by the frequency; the at least two second conductive lands and the at least one channel occupying a second area generally in register with the first area; and (d) a tunable dielectric material at least substantially filling the at least one channel; the tunable dielectric layer being electrically coupled with at least two second conductive lands of the at least two second conductive lands.

It is, therefore, an object of the present invention to provide an apparatus for effecting tunable phase shifting of electromagnetic signals that permits closely arranged arrays of small antenna patch elements.

Further objects and features of the present invention will be apparent from the following specification and claims when considered in connection with the accompanying drawings, in which like elements are labeled using like reference numerals in the various figures, illustrating the preferred embodiments of the invention.

DETAILED DESCRIPTION OF THE PREFERRED EMBODIMENT

Figure 1:
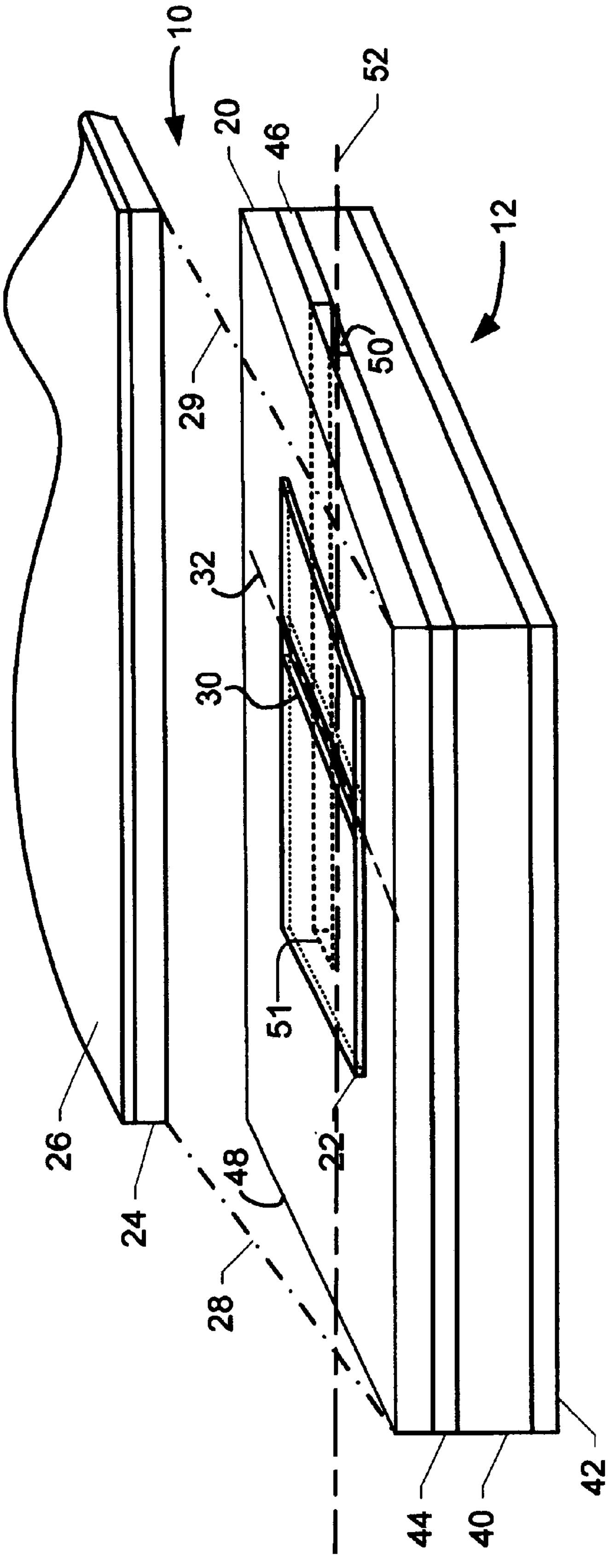
FIG. 1 (PRIOR ART)
FIG. 1 is a schematic perspective view of a prior art electromagnetic signal coupling arrangement with an antenna element.

FIG. 1 is a schematic perspective view of a prior art electromagnetic signal coupling arrangement with an antenna element. In FIG. 1, an antenna element 10 and a slot line electromagnetic coupling structure 12 are illustrated in an installed orientation. Antenna element 10 is illustrated in a partially exploded view in order to simplify FIG. 1. Antenna element 10 includes a first dielectric substrate 20 with a first conductive element 22 on first substrate 20. Antenna element 10 further includes a second dielectric substrate 24 with a second conductive element 26 on second substrate 24. First conductive element 22 is separated from second conductive element 26 by second substrate 24. First substrate 20, first conductive element 22, second substrate 24 and second conductive element 26 are all substantially planar. In an assembled orientation, first substrate 20, first conductive element 22, second substrate 24 and second conductive element 26 are in a substantially parallel abutting relationship and substantially in register, as indicated by dotted lines 28, 29.

An aperture 30 traverses first conductive element 22. Antenna element 10 is designed for efficient performance at an operating frequency $f_0$. Dimensions of aperture 30 are determined for efficient operation as a function of operating frequency $f_0$. Aperture 30 is preferably substantially rectangular oriented about a major axis 32.

Slot line coupling structure 12 includes a first dielectric slot line substrate 40 with a first transmission conductive layer 42 on a side of first slot line substrate 40 that is distal from antenna element 10, and a second transmission conductive layer 44 on a side of first slot line substrate 40 that is proximal to antenna element 10. Second transmission conductive layer 44 has a slot 50 traversing second transmission conductive layer 44. Slot 50 extends from a first edge 46 toward a second edge 48 opposing first edge 46 to a slot termination locus 51. Slot 50 is oriented about an axis 52. Axes 32, 52 are substantially perpendicular.

Thus, electromagnetic signals are transmitted, for example, from a signal coupling locus (not shown in FIG. 1) along slot 50 toward slot termination locus 51. As the transmitted signals pass aperture 30, electromagnetic coupling occurs through aperture 30 to establish a transmission path with respect to antenna element 10. That is, the coupled signals are transmitted by cooperation of first conductive element 22 and second conducive element 24. In such manner, signals from a host device (not shown in FIG. 1) are transmitted to antenna element 10 for transmission via slot 50 and via signal coupling via aperture 30.

One skilled in the art of antenna design will recognize that receive operations by antenna element 10 will be carried out in substantially the same manner to couple signals received by antenna element 10, via aperture 30 to slot 50 and thence via slot 50 to a host device (not shown in FIG. 1). Transmitting operations of antenna elements, including the antenna apparatus of the present invention, are used frequently throughout this specification as illustrative of the operation of antenna apparatuses in either transmission or reception operations.

A significant shortcoming of the prior art coupling arrangement illustrated in FIG. 1 is the parallel relationship of antenna element 10 and slot line coupling structure 12. One must provide sufficient expanse for antenna element 10, or provide sufficient space between adjacent antenna elements 10 (i.e., in an array of a plurality of antenna elements 10), to accommodate the lateral room required by slot line coupling structure 12 to reach its host device (not shown in FIG. 1). This requirement for lateral room by slot line coupling structure 12 is a drawback in antenna devices using a plurality of antenna elements 10, such as by way of example and not by way of limitation an array of antenna patch elements configured for operation as a steerable beam antenna device. The lateral room requirement for slot line coupling structure 12 limits how close adjacent antenna patch elements (e.g., antenna element 10; FIG. 1) can be placed, and may also limit how small each respective antenna element 10 may be.

Figure 2:
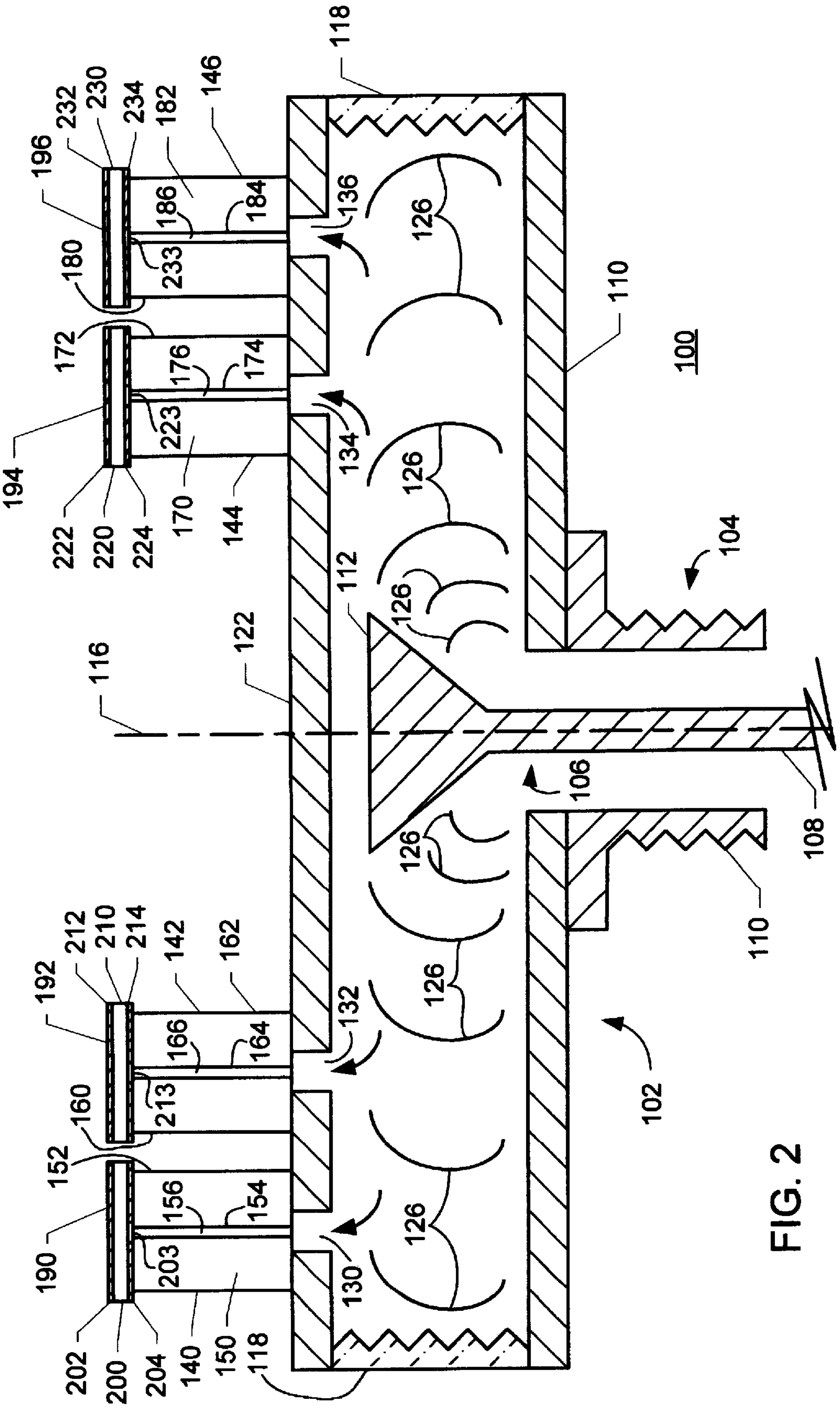
FIG. 2 is a schematic section view of the antenna apparatus of the present invention.

FIG. 2 is a schematic section view of the antenna apparatus of the present invention. In FIG. 2, an antenna apparatus includes a radial waveguide 102 coupled with a signal transfer structure 104 at a signal transfer locus 106. Signal transfer structure 104 is representatively illustrated in FIG. 2 as a coaxial cable 108 borne in a grounded sheath 110. Other signal transfer structures, such as a waveguide, a two-line transmission line, a slot line or another signal transmission structure may be employed within the intended scope of the invention.

Coaxial cable 108 is coupled with a transition element 112. Transition element 112 facilitates substantially even distribution of energy coupled from coaxial cable 108 to radial waveguide 102. Radial waveguide 102 includes a first conductive member 120 and a second conductive member 122. Conductive members 120, 122 are preferably metal, preferably substantially circular and centered on a common axis 116, preferably planar and preferably parallel. FIG. 2 illustrates radial waveguide 102 in a section view taken substantially along a diameter of conductive members 120, 122. Signal transfer locus 106 is substantially at axis 116. A dielectric material may be introduced between conductive members 120, 122 if desired (not shown in FIG. 2). Grounded sheath 110 is connected with conductive member 120. A wall 118 of signal absorbing material preferably establishes an outer boundary for radial waveguide 102.

Second conductive member 122 is provided with a plurality of signal coupling loci embodied in a plurality of signal coupling apertures, or slots 130, 132, 134, 136. Signal coupling slots 130, 132, 134, 136 traverse second conductive member 122.

A plurality of signal coupling elements 140, 142, 144, 146 are provided. Each respective signal coupling element 140, 142, 144, 146 is substantially in register with a respective signal coupling slot 130, 132, 134, 136. Each respective signal coupling element 140, 142, 144, 146 is embodied in a slot line signal transmission structure having one side of a substrate clad or covered in a conductive, preferably metal, layer, and an opposing side of the substrate bearing two conductive, preferably metal, lands with a narrow substantially linear slot separating the two lands. Antenna apparatus 100 is designed for efficient performance at an operating frequency $f_0$. The width of the slot that separates the two conductive lands on one side of each respective signal coupling element 140, 142, 144, 146 is a function of operating frequency $f_0$.

Thus, signal coupling element 140 has two metal lands 150, 152 separated by a slot 154. A substrate 156 is visible in FIG. 2 between lands 150, 152. Another conductive land on the opposing side of substrate 156 is not visible in FIG. 2. Signal coupling element 142 has two metal lands 160, 162 separated by a slot 164. A substrate 166 is visible in FIG. 2 between lands 160, 162. Another conductive land on the opposing side of substrate 166 is not visible in FIG. 2. Signal coupling element 144 has two metal lands 170, 172 separated by a slot 174. A substrate 176 is visible in FIG. 2 between lands 170, 172. Another conductive land on the opposing side of substrate 176 is not visible in FIG. 2. Signal coupling element 146 has two metal lands 180, 182 separated by a slot 184. A substrate 186 is visible in FIG. 2 between lands 180, 182. Another conductive land on the opposing side of substrate 186 is not visible in FIG. 2.

A plurality of antenna elements 190, 192, 194, 196 are couplingly provided electromagnetic signals by signal coupling elements 140, 142, 144, 146. Each respective antenna element 190, 192, 194, 196 is substantially in register with a respective signal coupling element 140, 142, 144, 146. Each respective antenna element 190, 192, 194, 196 is embodied in a substrate clad or covered in a conductive, preferably metal, layer on each of two opposing faces, or sides. Thus, antenna element 190 is embodied in a substrate 200 with conductive, preferably metal, layers 202, 204 on opposing faces of substrate 200. Antenna element 192 is embodied in a substrate 210 with conductive, preferably metal, layers 212, 214 on opposing faces of substrate 210. Antenna element 194 is embodied in a substrate 220 with conductive, preferably metal, layers 222, 224 on opposing faces of substrate 220. Antenna element 196 is embodied in a substrate 230 with conductive, preferably metal, layers 232, 234 on opposing faces of substrate 230.

Coupling apertures are provided in each respective antenna element metal layer adjacent with a respective coupling element for effecting coupling between a respective signal coupling element—antenna element pair. Thus, metal layer 204 of antenna element 190 is provided with an aperture 203 substantially in register with slot 154 of signal coupling element 140. Metal layer 214 of antenna element 192 is provided with an aperture 213 substantially in register with slot 164 of signal coupling element 142. Metal layer 224 of antenna element 194 is provided with an aperture 223 substantially in register with slot 174 of signal coupling element 144. Metal layer 234 of antenna element 196 is provided with an aperture 233 substantially in register with slot 184 of signal coupling element 146.

Energy is couplingly provided from coaxial cable 108 at signal transfer locus 106. Transition element 112 assists in substantially evenly distributing electromagnetic energy in the form of electromagnetic waves 126. Energy embodied in electromagnetic waves 126 is couplingly transferred with signal coupling elements 140, 142, 144, 146 via signal coupling slots 130, 132, 134, 136. Signal coupling elements 140, 142, 144, 146 couplingly transfer electromagnetic energy via slots 154, 164, 174, 184 and apertures 203, 213, 223, 233 with antenna elements 190, 192, 194, 196. Orientation of each respective signal coupling slot 130, 132, 134, 136 determines the portion of the respective electromagnetic wave 126 traversing a respective signal coupling slot 130, 132, 134, 136. It is by selectively orienting respective signal coupling slots 130, 132, 134, 136 that one may assure that respective electromagnetic signals 126 arriving at respective signal coupling elements 140, 142, 144, 146 are substantially of equal signal strength. This aspect of the antenna apparatus of the present invention is discussed in greater detail in connection with FIG. 7.

Figure 3:
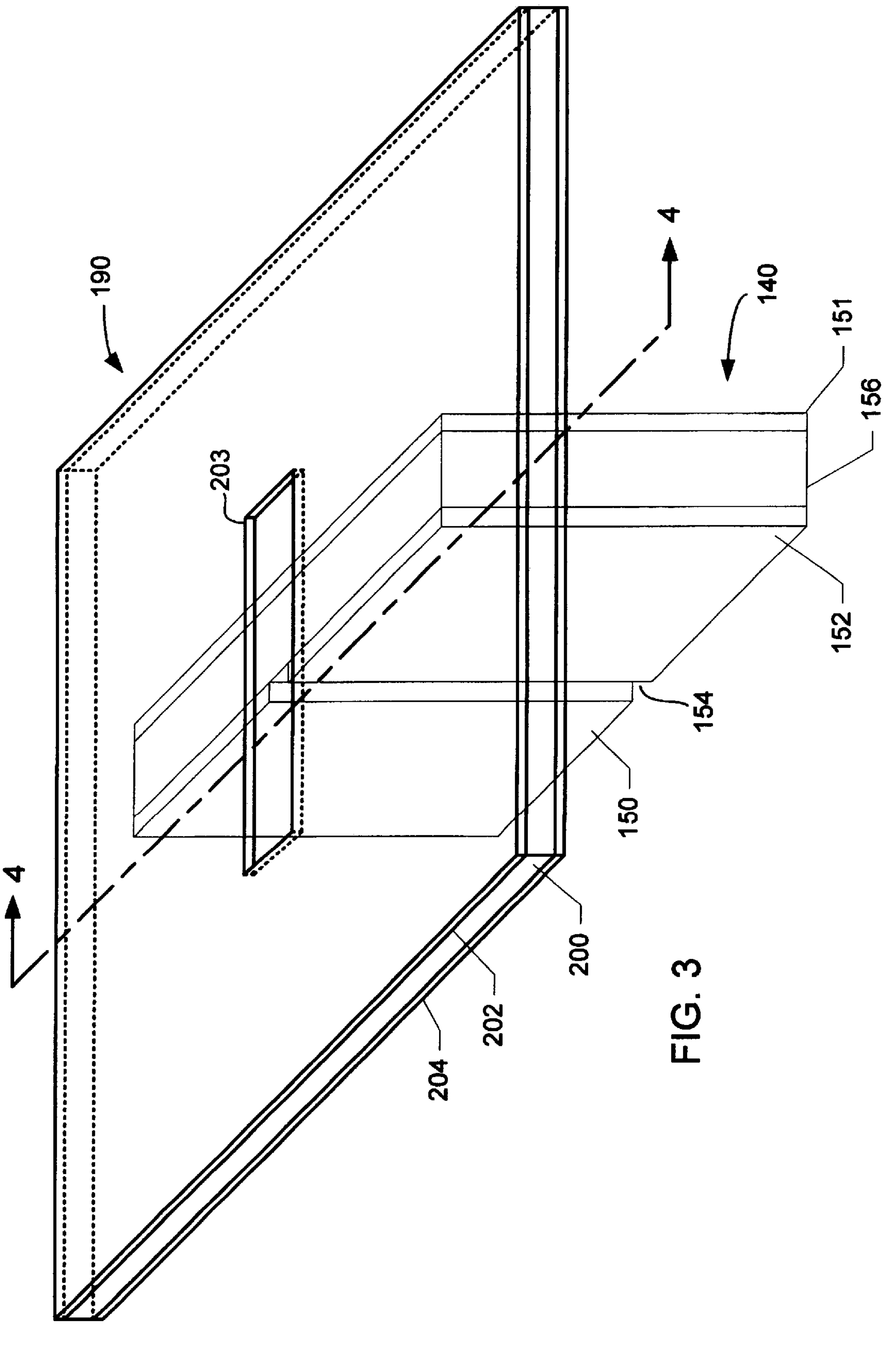
FIG. 3 is a schematic perspective view of an electromagnetic signal coupling arrangement with an antenna element employed with the preferred embodiment of the present invention.

FIG. 3 is a schematic perspective view of an electromagnetic signal coupling arrangement with an antenna element employed with the preferred embodiment of the present invention. Elements illustrated in FIG. 2 are indicated with like reference numerals in FIG. 3. In FIG. 3, signal coupling element 140 has two conductive, preferably metal lands 150, 152 on one face, or side of a substrate 156. A slot 154 extends to substrate 156 and separates metal lands 150, 152. Another metal land 151 is borne upon an opposing face of substrate 156. Antenna element 190 is embodied in a substrate 200 with conductive, preferably metal layers 202, 204 on opposing faces of substrate 200. Antenna element 190 is in substantially abutting relationship with signal coupling element 140. Antenna element 190 includes a coupling aperture 203 traversing metal layer 204. Signal coupling element 140 is illustrated in phantom to clearly indicate its relationship with coupling aperture 203. Coupling aperture 203 is substantially in register with slot 154. Electromagnetic signals are conveyed or transmitted by slot 154 to be coupled via coupling aperture 203 with antenna element. Signal coupling element 140 is substantially planar. Antenna element 190 is substantially planar. Signal coupling element 140 is substantially perpendicular with antenna element 190. In the substantially perpendicular arrangement between signal coupling element 140 and antenna element 190 there is little lateral space required by signal coupling element 140 for delivering electromagnetic signals to antenna element 190. The advantageous structure illustrated in FIG. 3 permits using smaller antenna elements 190 in denser, more closely juxtaposed arrays of antenna elements than is feasible using the prior art coupling arrangement illustrated in FIG. 1.

Figure 4:
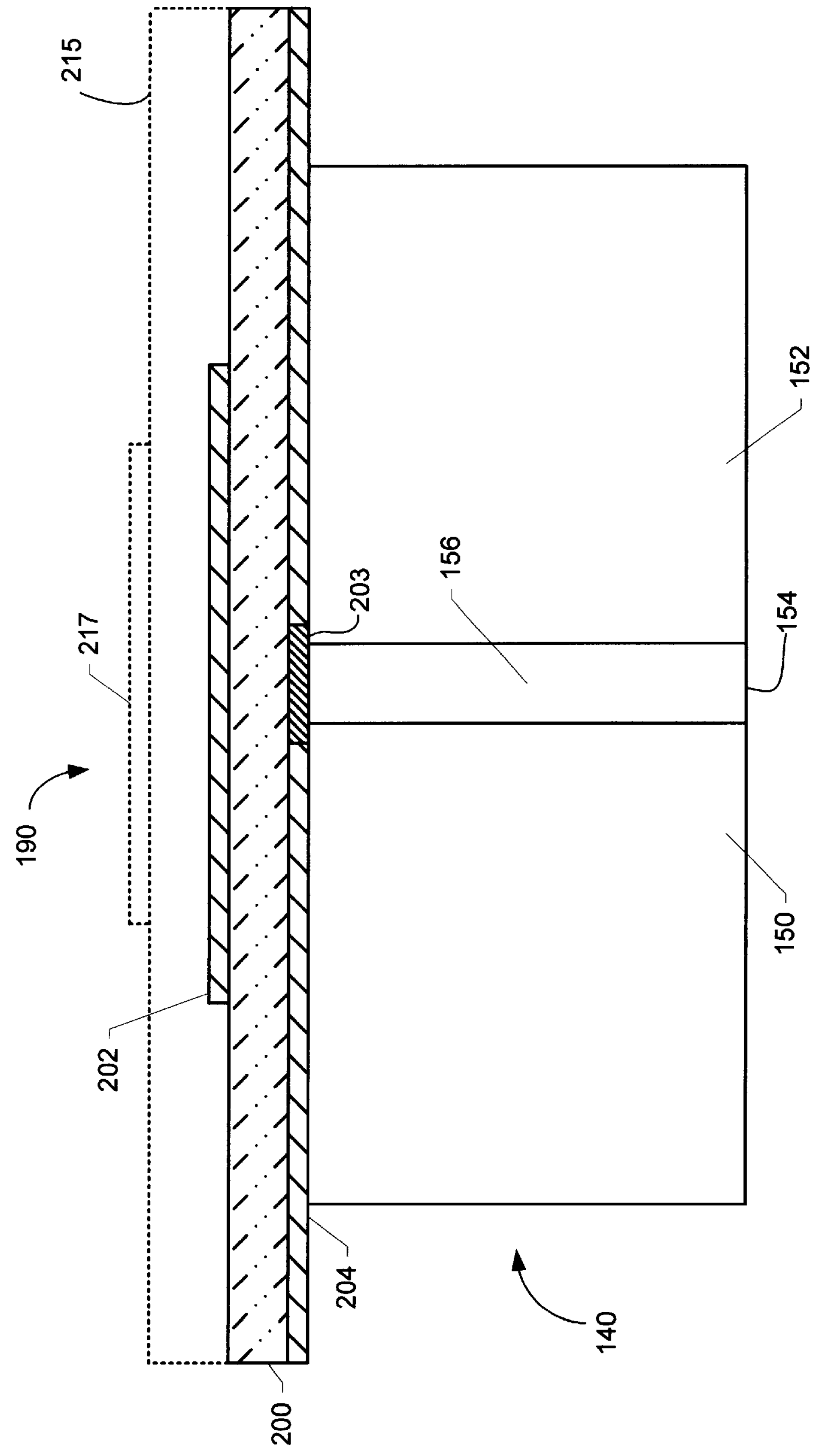
FIG. 4 is a schematic section view of the coupling arrangement illustrated in FIG. 3, taken along Section 4—4 in FIG. 3.

FIG. 4 is a schematic section view of the coupling arrangement illustrated in FIG. 3, taken along Section 4—4 in FIG. 3. Elements illustrated in FIG. 3 are indicated with like reference numerals in FIG. 4. In FIG. 4, signal coupling element 140 has two conductive, preferably metal lands 150, 152 on one face, or side of a substrate 156. A slot 154 extends to substrate 156 and separates metal lands 150, 152. Another metal land (metal land 151; FIG. 3) that is borne upon an opposing face of substrate 156 is not visible in FIG. 4. Antenna element 190 is embodied in a substrate 200 with conductive, preferably metal layers 202, 204 on opposing faces of substrate 200. Antenna element 190 is in substantially abutting relationship with signal coupling element 140. Antenna element 190 includes a coupling aperture 203 traversing metal layer 204. Coupling aperture 203 is substantially in register with slot 154. Electromagnetic signals are conveyed or transmitted by slot 154 to be coupled via coupling aperture 203 with antenna element. Signal coupling element 140 is substantially planar. Antenna element 190 is substantially planar. Signal coupling element 140 is substantially perpendicular with antenna element 190. An additional feature that may be employed in connection with antenna element 190 is illustrated in FIG. 4 in dotted line format to indicate the alternate nature of the additional structure. That is, in an alternate embodiment of the antenna apparatus of the present invention, an additional substrate 215 may be borne upon metal layer 202, and an additional conductive, preferably metal layer 217 may be borne upon substrate 215 on a face distal from conductive layer 202. Providing an additional metal layer 217 within electromagnetic coupling range of metal layer 202 permits operation of antenna element 190 as a broadband antenna.

Figure 5:
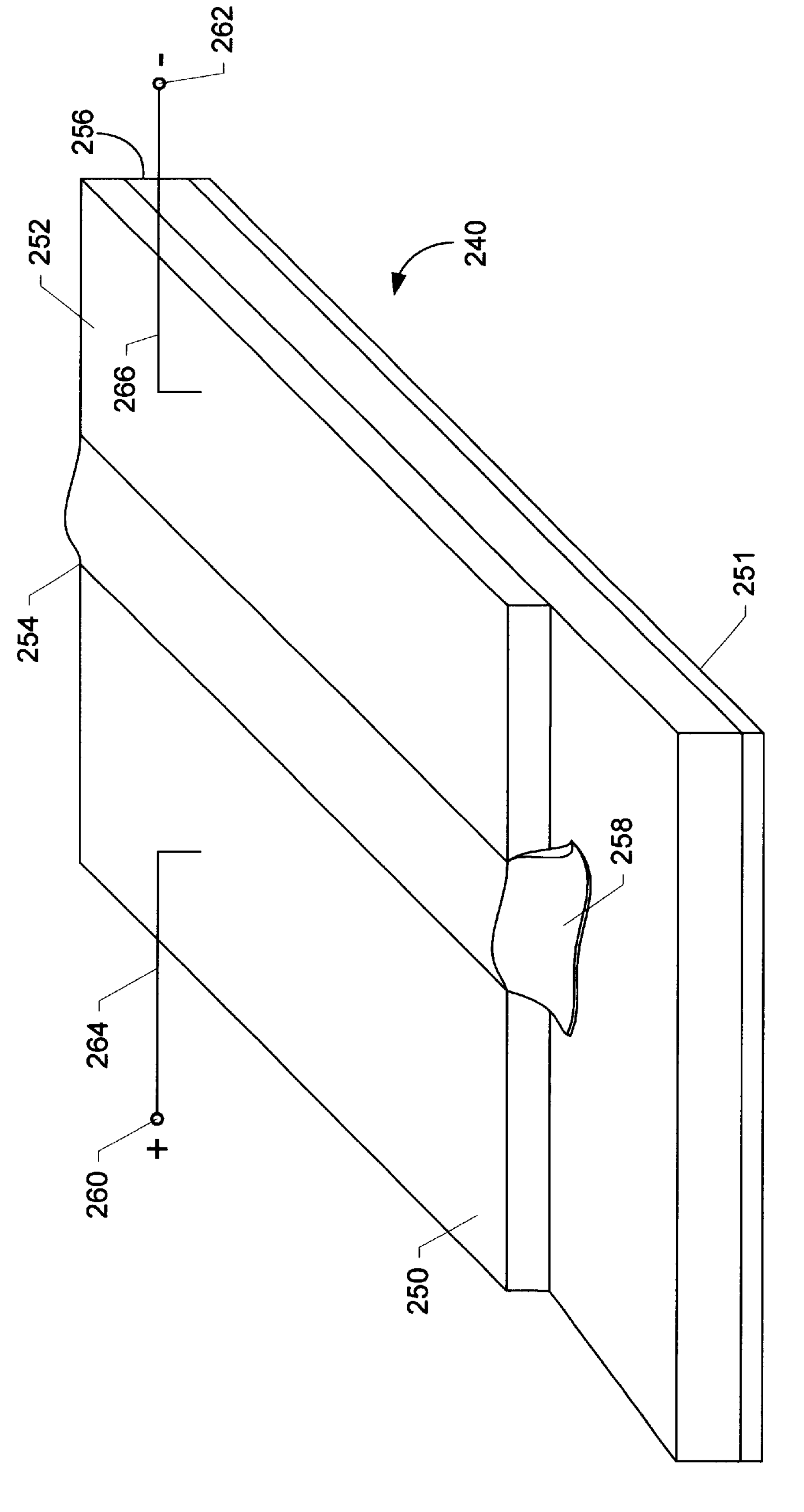
FIG. 5 is a schematic perspective view of a signal coupling element employed in the preferred embodiment of the present invention.

FIG. 5 is a schematic perspective view of a signal coupling element employed in the preferred embodiment of the present invention. In FIG. 5, a signal coupling element 240 is configured substantially as described earlier in connection with FIGS. 2–4, with the additional feature that signal coupling element 240 is configured for phase shifting operation. Thus, signal coupling element 240 has two conductive, preferably metal lands 250, 252 on one face, or side of a substrate 256. Another metal land 251 is borne upon an opposing face of substrate 256. A slot 254 extends to substrate 256 and separates metal lands 250, 252.

Slot 254 is filled with a dielectric phase shifting material 258. Phase shifting material 258 may somewhat overfill slot 254, so long as an electrical potential may be applied across phase shifting material 258, as by applying a voltage across metal lands 250, 252 from terminals 260, 262 via electrical leads 264, 266. Phase shifting material 258 can be tuned at room temperature to alter the phase of electromagnetic signals traversing phase shifting material 258 in slot 254 by controlling an electric field across phase shifting material 258. Such tuning may be effected, for example, by altering electrical potential across metal lands 250, 252 via terminals 260, 262 and electrical leads 264, 266. Phase shifting material 258 is preferably substantially the same material as is described in U.S. patent application Ser. No. 09/838,483, filed Apr. 19, 2001, by Louise C. Sengupta and Andrey Kozyrev, for "WAVEGUIDE-FINLINE TUNABLE PHASE SHIFTER", assigned to the assignee of the present invention. That is, the preferred embodiment of phase shifting material 258 is comprised of Barium-Strontium Titanate, $Ba_xSr_{1-x}TiO_3$ (BSTO), where x can range from zero to one, or BSTO-composite ceramics. Examples of such BSTO composites include, but are not limited to: BSTO-MgO, BSTO-$MgAl_2O_4$, BSTO-$CaTiO_3$, BSTO-$MgTiO_3$, BSTO-$MgSrZrTiO_6$ and combinations thereof. Other materials suitable for employment as phase shifting material 258 may be used partially or entirely in place of barium strontium titanate. An example is $Ba_xCa_{1-x}TiO3$, where x ranges from 0.2 to 0.8, and preferably from 0.4 to 0.6. Additional alternate materials suitable for use as phase shifting material 258 include ferroelectrics such as $Pb_xZr_{1-x}TiO3$ (PZT) where x ranges from 0.05 to 0.4, lead lanthanum zirconium titanate (PLZT), lead titanate ($PbTiO_3$), barium calcium zirconium titanate ($BaCaZrTiO_3$), sodium nitrate ($NaNO_3$), $KNbO_3$, $LiNbO_3$, $LiTaO_3$, $PbNb_2O_6$, $PbTa_2O_6$, $KSr(NbO_3)$ and $NaBa_2(NbO_3)_5$ and $KH_2PO_4$. In addition, phase shifting material 258 may include electronically tunable materials having at least one metal silicate phase. The metal silicates may include metals from Group 2A of the Periodic Table, i.e., Be, Mg, Ca, Sr, Ba, and Ra, preferably Mg, Ca, Sr and Ba. Preferred metal silicates include $Mg_2SiO_4$, $CaSiO_3$, $BaSiO_3$ and $SrSiO_3$. In addition to Group 2A metals, metal silicates in phase shifting material 258 may include metals from Group 1A, i.e., Li, Na, K, Rb, Cs and Fr, preferably Li, Na and K. For example, such metal silicates may include sodium silicates such as $Na_2SiO_3$ and $NaSiO_3$-$5H_2O$, and lithium-containing silicates such as $LiAlSiO_4$, $Li_2SiO_3$ and $Li_4SiO_4$. Metals from Groups 3A, 4A and some transition metals of the Periodic Table may also be suitable constituents of the metal silicate phase of phase shifting material 258. Additional metal silicates may include $Al_2Si_2O_7$, $ZrSiO_4$, $KAlSi_3O_8$, $NaAlSi_3O_8$, $CaAl_2Si_2O_8$, $CaMgSi_2O_6$, $BaTiSi_3O_9$ and $Zn_2SiO_4$.

Figure 6:
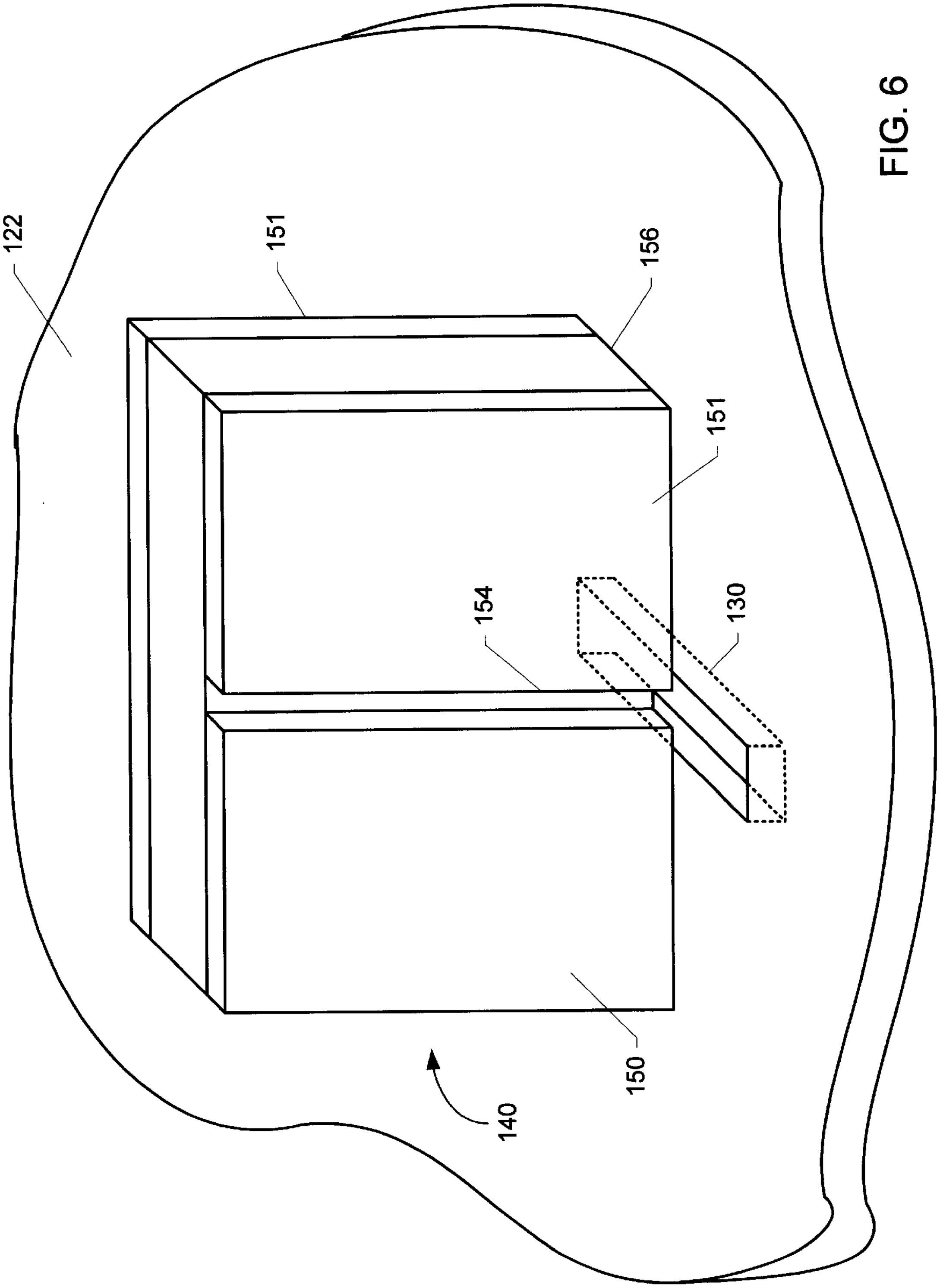
FIG. 6 is a schematic perspective view of an electromagnetic signal coupling arrangement with a radial waveguide element employed in the present invention.

FIG. 6 is a schematic perspective view of an electromagnetic signal coupling arrangement with a radial waveguide element employed in the present invention. Elements illustrated in FIGS. 2–4 are indicated with like reference numerals in FIG. 6. In FIG. 6, conductive member 122 is provided with a signal coupling aperture, or slot 130. Signal coupling slot 130 traverses second conductive member 122. Signal coupling element 140 is substantially in register with signal coupling slot 130. Signal coupling element 140 is embodied in a slot line signal transmission structure having one side of a substrate clad or covered in a conductive, preferably metal, layer, and an opposing side of the substrate bearing two conductive, preferably metal, lands with a narrow substantially linear slot separating the two lands. Antenna apparatus 100 (FIG. 2) is designed for efficient performance at an operating frequency $f_0$. The width of the slot that separates the two conductive lands on one side of signal coupling element 140 is a function of operating frequency $f_0$. Thus, signal coupling element 140 has two metal lands 150, 152 on one side or face of a substrate 156 separated by a slot 154. Another conductive land 151 is on the opposing face of substrate 156.

Figure 7:
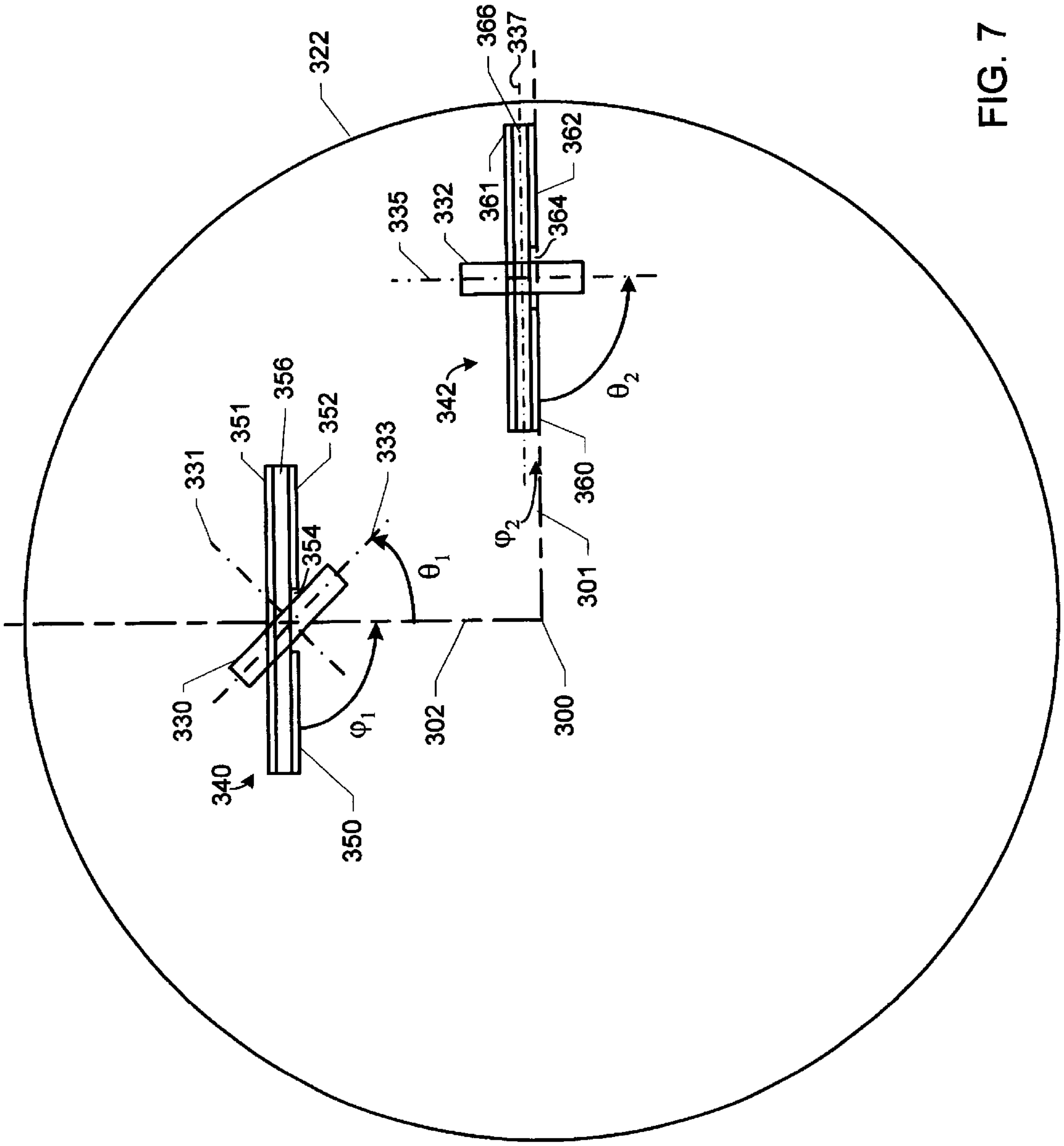
FIG. 7 is a top plan schematic view illustrating details relating to construction of the preferred embodiment of selected portions of the antenna apparatus of the present invention.

FIG. 7 is a top plan schematic view illustrating details relating to construction of the preferred embodiment of selected portions of the antenna apparatus of the present invention. In FIG. 7, a circular conductive member 322 of an antenna apparatus has two signal coupling elements 340, 342. Conductive member 322 is similar to second conductive member 122 (FIG. 2); signal coupling elements 340, 342 are similar to signal coupling elements 140, 142 (FIG. 2). Signal coupling apertures, or slots 330, 332 traverse conductive member 322. Signal coupling slots 330, 332 are similar to signal coupling slots 130, 132 (FIG. 2).

Signal coupling element 340 has two metal lands 350, 352 on one side or face of a substrate 356 separated by a slot 354. Another conductive land 351 is on the opposing face of substrate 356. Signal coupling element 342 has two metal lands 360, 362 on one side or face of a substrate 366 separated by a slot 364. Another conductive land 361 is on the opposing face of substrate 366. Signal coupling elements 340, 342 are oriented on conductive member 322 with their respective substrates 356, 366 parallel with a radius 301 from center 300 of conductive member 322. A second radius 302 is substantially perpendicular with radius 301 so that substrate 356 is substantially perpendicular with radius 302. A coupling element angle $\phi$ defines the angle established between the planar face of a respective signal coupling element and a radius substantially bisecting a coupling slot in the respective signal coupling element. Thus, angle $\phi_1$ is established for signal coupling element 340 with respect to radius 302 at substantially 90 degrees. Angle $\phi_2$ is established for signal coupling element 342 with respect to radius 301 at substantially 0 degrees. The antenna apparatus of the present invention typically employs a greater number of signal coupling elements (and associated antenna elements) in a more closely packed, denser distribution on conductive member 322 than are shown in FIG. 7. Only signal coupling elements 340, 342 are shown in FIG. 7 in order to simplify the drawing to facilitate understanding the invention. It is preferred, but not required that the various signal coupling elements 340, 342 be oriented parallel with a common radius, as illustrated in FIG. 7. However, also in the interest of simplifying FIG. 7 to facilitate understanding the invention, signal coupling elements 340, 342 are both parallel with radius 301.

Signal coupling slot 330 is substantially rectangular having a major axis 333 and a minor axis 331 substantially perpendicular with major axis 333. Energy is transferred across signal coupling slot 330 substantially parallel with minor axis 331 for effecting electromagnetic signal coupling with signal coupling element 340. Major axis 333 establishes a coupling slot angle $\theta_1$ with radius 302. Energy transferred across signal coupling slot 330 parallel with minor axis 331 is a vector component of signals propagated from center 300 (described in connection with FIG. 2). If minor axis 331 is perpendicular with radius 302, then no component of energy will be available for transfer across signal coupling slot 330 parallel with minor axis 331. Signal coupling slot 332 is substantially rectangular having a major axis 335 and a minor axis 337 substantially perpendicular with major axis 335. Energy is transferred across signal coupling slot 332 substantially parallel with minor axis 337 for effecting electromagnetic signal coupling with signal coupling element 342. Major axis 335 establishes a coupling slot angle $\theta_2$ with radius 301. Energy transferred across signal coupling slot 332 parallel with minor axis 337 is a vector component of signals propagated from center 300 (as described in connection with FIG. 2). If minor axis 337 is perpendicular with radius 301, then no component of energy will be available for transfer across signal coupling slot 332 parallel with minor axis 337.

The inventor has discovered that it is preferable for coupling element angle $\phi$ and coupling slot angle $\theta$ to be related according to the following expression in order to assure effective coupling across respective coupling slots to respective coupling elements:

$$\phi=180-2\theta \quad [1]$$

Given such a relation between coupling element angle ($\phi$ and coupling slot angle $\theta$ it may be observed that the respective angles may range among the following values:

$$\phi\rightarrow 0 \text{ degrees to } 90 \text{ degrees} \quad [2]$$

$$\theta\rightarrow 90 \text{ degrees to } 45 \text{ degrees} \quad [3]$$

By arranging the dimensions of signal coupling slots, such as signal coupling slots 330, 332, to accommodate a desired operating frequency $f_0$ and by adjusting the attitude (manifested in respective coupling slot angles $\theta$ and coupling element angles $\phi$) of respective signal coupling slots, such as signal coupling slots 330, 332, one can control the amount of energy couplingly transferred between a respective signal coupling slot and its associated signal coupling element for further transfer with a respective antenna element (not shown in FIG. 7; see FIG. 2). This capability to control the mount of energy couplingly transferred permits a designer to assure that varying distance from a signal transfer locus (e.g., signal transfer locus 106; FIG. 2) at center 300 of conductive member 322 may be accommodated to ensure that signals couplingly provided to respective signal coupling elements via respective signal coupling slots will be of substantially equal signal strength. Thus, coupling slot angles $\theta_1$, $\theta_2$ may be individually selected for signal coupling slots 330, 332 to assure that signals couplingly transferred with signal coupling elements 340, 342 have substantially equal signal strength despite signal coupling slots 330, 332 being at different distances from center 300, and despite coupling element angles $\phi_1$, $\phi_1$ being different for respective signal coupling elements 340, 342.

The antenna apparatus of the present invention permits denser juxtaposition of smaller individual antenna patch elements than is permitted using prior art coupling technology (FIG. 1). Moreover, the antenna apparatus of the present invention is particularly well suited for steerable beam antenna arrays because it provides a compact phase adjusting structure and a design facility for equalizing signal strengths of various signals couplingly provided to respective antenna patch elements.

It is to be understood that, while the detailed drawings and specific examples given describe preferred embodiments of the invention, they are for the purpose of illustration only, that the apparatus of the invention is not limited to the precise details and conditions disclosed and that various changes may be made therein without departing from the spirit of the invention which is defined by the following claims:

I claim:

1. A tunable electromagnetic transmission structure for effecting coupling of electromagnetic signals having a frequency; the apparatus comprising:

(a) a dielectric substrate having a first side, and having a second side in opposing relation to said first side;

(b) at least one first conductive land carried by said substrate on said first side; said at least one first conductive land occupying a first area on said first side;

(c) at least two second conductive lands carried by said substrate on said second side; said at least two conductive lands being separated by at least one substantially linear channel; said at least one channel having a width established by said frequency; said at least two second conductive lands and said at least one channel occupying a second area on said second side; said second area being generally in register with said first area; and (d) a tunable dielectric material at least substantially filling said at least one channel; said tunable dielectric material being electrically coupled with at least two second conductive lands of said at least two second conductive lands.

2. A tunable electromagnetic transmission structure for effecting coupling of electromagnetic signals as recited in claim 1 wherein said dielectric substrate is substantially planar.

3. A tunable electromagnetic transmission structure for effecting coupling of electromagnetic signals as recited in claim 2 wherein said at least one first conductive land is one first metal land.

4. A tunable electromagnetic transmission structure for effecting coupling of electromagnetic signals as recited in claim 3 wherein said at least two second conductive lands is two second metal lands.

5. A tunable electromagnetic transmission structure for effecting coupling of electromagnetic signals as recited in claim 4 wherein said first area is substantially equal with said second area.

6. A tunable electromagnetic transmission structure for effecting coupling of electromagnetic signals as recited in claim 5 wherein said tunable dielectric material partially overlays said at least two second metal lands.

7. A tunable electromagnetic transmission structure for effecting coupling of electromagnetic signals as recited in claim 6 wherein said tunable dielectric material comprises a material selected from the group of: barium strontium titanate, barium calcium titanate, lead zirconium titanate, lead lanthanum zirconium titanate, lead titanate, barium calcium zirconium titanate, sodium nitrate, KNbO3, LiNbO3, LiTaO3, PbNb2O6, PbTa2O6, KSr(NbO3), NaBa2 (NbO3)5, KH2PO4, and combinations thereof.

8. A tunable electromagnetic transmission structure for effecting coupling of electromagnetic signals as recited in claim 6 wherein said tunable dielectric material comprises a material selected from the group of: Mg2SiO4, CaSiO3, BaSiO3, SrSiO3, Na2SiO3, NaSiO3-5H2O, LiAlSiO4, Li2SiO3, Li4SiO4, Al2Si2O7, ZrSiO4, KAlSi3O8, NaAlSi3O8, CaAl2Si2O8, CaMgSi2O6, BaTiSi3O9 and Zn2SiO4.

9. A tunable electromagnetic transmission structure for effecting coupling of electromagnetic signals as recited in claim 6 wherein said tunable dielectric material comprises a material selected from the group of: Mg2SiO4, CaSiO3, BaSiO3, SrSiO3, Na2SiO3, NaSiO3-5H2O, LiAlSiO4, Li2SiO3, Li4SiO4, Al2Si2O7, ZrSiO4, KAlSi3O8, NaAlSi3O8, CaAl2Si2O8, CaMgSi2O6, BaTiSi3O9 and Zn2SiO4.

10. A tunable electromagnetic transmission structure for effecting coupling of electromagnetic signals as recited in claim 1 wherein said at least one first conductive land is one first metal land.

11. A tunable electromagnetic transmission structure for effecting coupling of electromagnetic signals as recited in claim 1 wherein said at least two second conductive lands is two second metal lands.

12. A tunable electromagnetic transmission structure for effecting coupling of electromagnetic signals as recited in claim 1 wherein said first area is substantially equal with said second area.

13. A tunable electromagnetic transmission structure for effecting coupling of electromagnetic signals as recited in claim 1 wherein said tunable dielectric material partially overlays said at least two second metal lands.

14. A tunable electromagnetic transmission structure for effecting coupling of electromagnetic signals as recited in claim 1 wherein said tunable dielectric material comprises a material selected from the group of: barium strontium titanate, barium calcium titanate, lead zirconium titanate, lead lanthanum zirconium titanate, lead titanate, barium calcium zirconium titanate, sodium nitrate, KNbO3, LiNbO3, LiTaO3, PbNb2O6, PbTa2O6, KSr(NbO3), NaBa2 (NbO3)5, KH2PO4, and combinations thereof.

15. A tunable electromagnetic transmission structure for effecting coupling of electromagnetic signals as recited in claim 1 wherein said tunable dielectric material comprises A tunable electromagnetic transmission structure for effecting coupling of electromagnetic signals as recited in claim 1 wherein said tunable dielectric material comprises a barium strontium titanate (BSTO) composite selected from the group of: BSTO-MgO, BSTO-MgAl2O4, BSTO-CaTiO3, BSTO-MgTiO3, BSTO-MgSrZrTiO6, and combinations thereof.

16. A tunable electromagnetic transmission structure for effecting coupling of electromagnetic signals as recited in claim 1 wherein said tunable dielectric material comprises a material selected from the group of: Mg2SiO4, CaSiO3, BaSiO3, SrSiO3, Na2SiO3, NaSiO3-5H2O, LiAlSiO4, Li2SiO3, Li4SiO4, Al2Si2O7, ZrSiO4, KAlSi3O8, NaAlSi3O8, CaAl2Si2O8, CaMgSi2O6, BaTiSi3O9 and Zn2SiO4.

17. A signal transfer apparatus for transferring electromagnetic signals having a frequency; the apparatus comprising:

(a) a generally planar dielectric substrate having a first face and a second face in opposing relation with said first face;

(b) a pair of first metal lands separated by a substantially linear metal-free slot line zone; said slot line zone having a width related to said frequency; said pair of first metal lands and said slot line zone occupying a first area on said first face;

(c) a second metal land occupying a second area on said second face; said second area and said first area being substantially in register;

(d) a tunable dielectric material at least substantially filling said slot line zone; said tunable dielectric layer being electrically coupled with said pair of first metal lands.

18. A signal transfer apparatus for transferring electromagnetic signals as recited in claim 17 wherein said first area and said second area are substantially equal.

* * * * *